United States Patent

Knutson et al.

[11] Patent Number: 5,826,607
[45] Date of Patent: Oct. 27, 1998

[54] DUAL EXHAUST CONTROLLER

[75] Inventors: Paul L. Knutson; Benjamin Garcia Rodriguez, both of San Antonio, Tex.

[73] Assignees: Sony Corporation, Park Ridge, N.J.; Sony Electronics Inc., Tokyo, Japan

[21] Appl. No.: 758,163
[22] Filed: Nov. 25, 1996
[51] Int. Cl.⁶ ..................................................... F16K 11/22
[52] U.S. Cl. .......................... 137/1; 137/565; 137/597; 137/624.18; 137/883
[58] Field of Search ................................ 137/597, 624.13, 137/624.18, 240, 883, 565, 1, 624.15, 624.2

[56] References Cited

U.S. PATENT DOCUMENTS

| | | | |
|---|---|---|---|
| 2,178,559 | 11/1939 | Cohen et al. | 137/597 |
| 5,313,982 | 5/1994 | Ohmi et al. | 137/597 |
| 5,368,062 | 11/1994 | Okumura | 137/624.18 X |
| 5,590,686 | 1/1997 | Prendergast | 137/597 |

*Primary Examiner*—Stephen M. Hepperle
*Assistant Examiner*—John Bastianelli
*Attorney, Agent, or Firm*—Wood, Herron & Evans, L.L.P.

[57] ABSTRACT

A dual exhaust controller for maintaining isolation between the flows of two different gases in a chamber. The controller includes first and second gas input valves connected between respective first and second sources of different gases and a processing chamber. A pump is fluidly connected to the chamber for exhausting gases therefrom and has first and second gas exhaust valves connected to an outlet of the pump. A gas flow control interlocks the signals operating the gas input valves with the states of first and second gas exhaust valves which exhaust the respective first and second gases from the chamber, so that the different gases are exhausted independently.

10 Claims, 3 Drawing Sheets

DUAL EXHAUST CONTROLLER

FIELD OF THE INVENTION

This invention relates to controlling gas flows and more particularly to a control system for exhaust valves for maintaining a separation between gas flows being exhausted from a chamber.

BACKGROUND OF THE INVENTION

Numerous industrial processes require control over the flow of different gases. For example, the control of gas flows is particularly important in a chemical vapor deposition ("CVD") process which is generally used to deposit a vapor phase of a material, for example, tungsten on a substrate, for example, a polymer. In the CVD process, various gases are used in the manufacture of a product, for example, silane ($SiH_4$) and a gas phase of the material to be deposited are pumped in combination with inert gases into a CVD reactor. At the end of the deposition process, the flow of the material and silane gases are terminated, while the flow of the inert gas may continued for some time. During the deposition process, a residue of the material being deposited may also build up on other components within the CVD reactor. When it is desired to clean the reactor, a gas used to chemically clean reactor components, for example, nitrogen trifluoride ($NF_3$) is pumped into the reactor. In addition, often an RF generator is used to create a plasma with the residue on the reactor components as part of the cleaning process. At the end of the cleaning process the flow of nitrogen trifluoride is terminated.

While the above gases are often used in the CVD process, it is known that the silane and nitrogen trifluoride gases, if mixed in the right proportions above 2 Torr, can be volatile and explosive. Therefore, it is a requirement of the process that such gases are kept isolated and never flow simultaneously through the reactor or the exhaust gas lines from the reactor. Further, while such gases are provided to the reactor through separate gas lines, it is also preferable that upon exiting the reactor, the gases again flow through separate exhaust lines. There are numerous schemes known for preventing the simultaneous flow of silane and nitrogen trifluoride gases. For example, in some devices, the pneumatic pressures operating the gas input valves are interlocked such that a backpressure in the pneumatic line operating the silane input gas valve is used to inhibit the operation of the nitrogen trifluoride input gas valve and vice versa. In other schemes, the gas flows are controlled by a programmable logic controller which is used to inhibit the flow of nitrogen trifluoride when the silane is flowing and vice versa. While such strategies have proven effective in the past, there is always a desire to improve on the prior devices both from the standpoint of reliability and cost.

SUMMARY OF THE INVENTION

The dual exhaust gas controller of the present invention is especially valuable for controlling the flow of two different potentially volatile gases in which the gases are exhausted and flow through separate paths.

According to the principles of the present invention and in accordance with the preferred embodiments, the dual exhaust controller includes first and second gas input valves connected between respective first and second sources of different gases and a processing chamber. A pump is fluidly connected to the chamber for exhausting gases therefrom and has first and second gas exhaust valves connected to an outlet of the pump. A gas flow control provides first and second gas supply signals to the respective first and second gas input valves. The control opens the first gas exhaust valve and closes the second gas exhaust valve in response to a first state of the second gas supply signal. The gas flow control opens the first input valve in response to the simultaneous occurrence of the open position of the first gas exhaust valve, the closed position of the second gas exhaust valve and the first gas supply signal having a state to open the first gas input valve and the second gas supply signal having a state to close the second gas input valve. Therefore, the first gas input valve is opened only if its respective exhaust valve is open, the other exhaust valve is closed, the first gas supply signal is commanding the first gas input valve to open. Thus, the flows of the two gases is isolated, so that the gases do not mix within the chamber or the exhaust lines.

These and other objects and advantages of the present invention will become more readily apparent during the following detailed description taken in conjunction with the drawings herein.

DETAILED DESCRIPTION OF THE INVENTION

Figure 1:
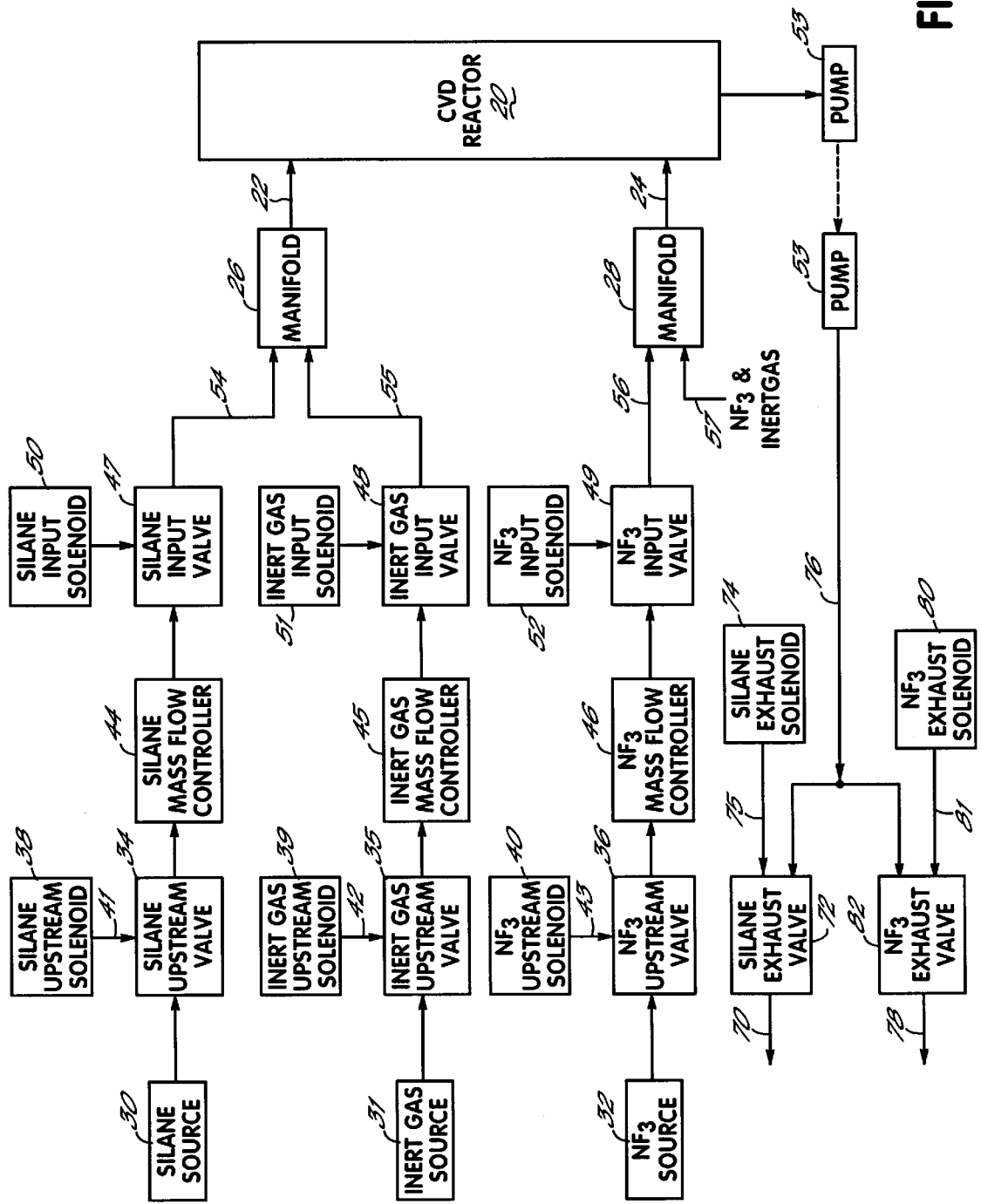
FIG. 1 is a block diagram of a gas flow control system including an exhaust flow control system in accordance with the principles of the present invention.

Referring to FIG. 1, a CVD reactor 20 has inputs 22, 24 connected to outputs from manifolds 26, 28 respectively. The reactor 20 is normally a cylindrical chamber in which the inlets 22, 24 provide gases to the chamber at a plurality of circumferential locations. Often, the sources of the gases are located upstream at remote storage locations as indicated by the silane gas source 30, the inert gas source 31 and the nitrogen trifluoride source 32. As will be appreciated, this application will explain all of the known gas flow controls associated with these three gases in a CVD process. Further, it is known that a CVD process may use one or more other gases, but for purposes of explanation of the present invention, only portions of the known gas flow control system for these three gases will be described. Also located upstream near the sources 30–32 are respective valves 34, 35, 36 operatively connected to their respective controlling solenoids 38, 39, 40. Normally, the solenoids 38–40 are in electrical communication with a gas flow control 100 (FIG. 2) that is operative to selectively energize and de-energize the solenoids 38–40 to respectively open and close valves 34–36. Preferably, the valves 34–36 are pneumatically operated devices; and therefore, in response to electrical control signals from the gas flow control 100, the solenoids 38–40 produce pneumatic pressure differentials on their outputs 41, 42, 43 that function to operate the valves 34–36. Mass flow controllers 44, 45, 46 also receive signals from the gas flow control 100 and are operative to control the quantity of the respective gas flowing there through. Input valves 47, 48, 49 are located downstream from the mass flow controllers 44–46 and are in the proximity of manifolds 26, 28 and the CVD reactor 20. The input valves 47–49 are again, preferably pneumatically controlled devices and are operated by respective input solenoids 50, 51, 52. The flow of gases through the reactor 20 is controlled by the pumps 53, which are normally serially connected together to provide the desired vacuum and gas flow within the reactor 20.

For any particular deposition process, different gases may be used at different times. Further, the operation of the reactor 20 is normally described in a recipe for the CVD process in which the types of gases used and the durations of gas flows are sequentially identified. The recipe is normally implemented using an automatic gas flow control. However, in all operating modes of the reactor 20, the pumps 53 are operating continuously; and therefore, it is required that a gas always be flowing through the reactor. Normally, during an idle or nonprocessing mode of operation, the inert gas is flowing through the reactor; and therefore, the gas flow control 100 is producing signals to the inert gas solenoids 39, 51 and inert gas mass flow controller 45 to open the inert gas valves 35, 48 to provide a flow of inert gas from the inert gas source 31, through the manifold 26 and into the reactor 20. That inert gas is also being exhausted by the pumps 53.

During a CVD processing cycle, often the recipe will call for the flow of other gases. In the example of this description, the other gases are silane ($SiH_4$) and tungsten hexafluoride ($WF_6$). To initiate the flow of silane, the gas flow control 100 provides signals to open silane gas valves 34, 47 and operate the silane gas mass flow controller 44, thereby causing silane gas to flow through the silane valves 34, 47 and into manifold 26. The silane gas is mixed with the inert gas in the manifold 26, and the combination of the silane and inert gases flows through the reactor 20. The gas flow control 100 simultaneously activates the flow of a mixture of tungsten hexafluoride ($WF_6$) and an inert gas to input 57 of manifold 28. The tungsten hexafluoride is mixed with the inert gas in a manifold (not shown) but in a manner similar to that just described with respect to the mixing of the silane and the inert gases. The mixture and flow of the tungsten hexafluoride and inert gases to the manifold 28 is controlled in a known manner utilizing solenoids, valves, and mass flow controllers as previously described with silane and the inert gas. According to the recipe, the mixtures of silane and inert gas and tungsten hexafluoride and inert gas flow through the reactor 20 for a predetermined period of time. At the end of that period of time, the gas flow control 100 de-energizes the silane solenoids 38, 50 and the silane mass flow controller 44, thereby closing the silane valves 34, 47 and terminating the flow of silane gas from the source 30. The flow of the tungsten hexafluoride is also simultaneously terminated, leaving only the flow of inert gas through the manifolds 26, 28 and the reactor 20.

As previously described, the silane and tungsten hexafluoride gases will flow for different periods during the CVD process during which silicon and/or other materials are deposited on a workpiece, for example, a wafer. However, simultaneously, a residue of the material being deposited on the workpiece is also being deposited on other components within the CVD reactor 20. At different times, it is desirable to clean the reactor and remove those residual deposits; and therefore, a cleaning cycle or mode is initiated. Normally, during the cleaning cycle, the flow of inert gas is terminated and a flow of nitrogen trifluoride is initiated. Therefore, the gas flow control 100 provides signals to de-energize the inert gas solenoids 39, 51 and the inert gas mass flow controller 45, thereby closing the inert gas valves 35, 48 and terminating the flow of inert gas from the source 31. Simultaneously, the gas flow control 100 energizes nitrogen trifluoride solenoids 40, 52 and nitrogen trifluoride mass flow controller 46, thereby opening nitrogen trifluoride valves 36, 49 and initiating the flow of nitrogen trifluoride from the source 32, through the manifold 28 and the reactor 20. During the flow of nitrogen trifluoride, an RF generator is often used to create a plasma with the residue on the reactor components as part of the cleaning process. At the end of the cleaning process, the gas flow control 100 de-energizes the nitrogen trifluoride solenoids 40, 52 and nitrogen trifluoride mass flow controller 46, thereby closing the nitrogen trifluoride valves 36, 49 and terminating the flow of nitrogen trifluoride from the source 32 through the manifold 28 and reactor 20. Simultaneously, the flow of inert gas is again initiated from its source 31, through the manifold 26 and reactor 20 as previously described. The flows of the inert, silane and nitrogen trifluoride gases described to this point are well known.

It is known that a mixture of the silane and nitrogen trifluoride gases in the right proportions above 2 Torr can be volatile and explosive. Therefore, it is a necessary that those gases be kept isolated and never flow simultaneously through the reactor. Further, separate exhaust paths may be provided to further isolate the silane gas and nitrogen trifluoride gases from each other. The silane gas exhaust path 70 includes a silane gas exhaust valve 72 and silane gas exhaust solenoid 74 connected to an output 76 of the pumps 53. Similarly, the nitrogen trifluoride exhaust path 78 includes a nitrogen trifluoride exhaust solenoid 80 for operating a nitrogen trifluoride exhaust valve 82 which also connected to the output 76 of the pumps 53. A feature of the present invention is to improve the control over the separation of the nitrogen trifluoride gas and the silane gas to prevent an accidental or inadvertent mixing. Known systems have interlocks for maintaining isolation. For example, in one system, the back pressure created by the opening of the silane input valve 47 is used to block or hold the nitrogen trifluoride input valve 49 in its closed position.

Figure 2:
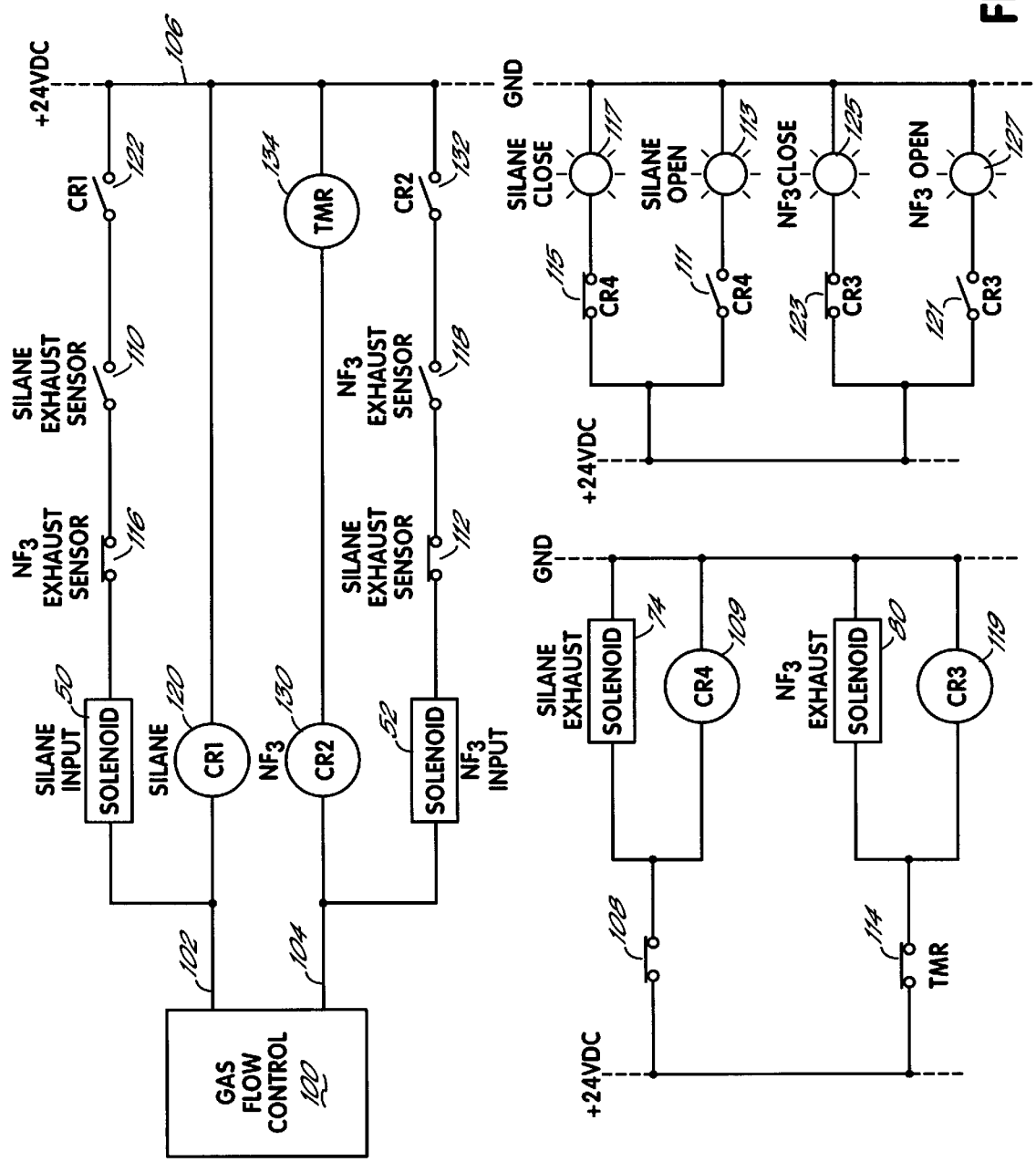
FIG. 2 is an electrical schematic diagram of a control circuit for the exhaust flow control system of FIG. 1.
Figure 3:
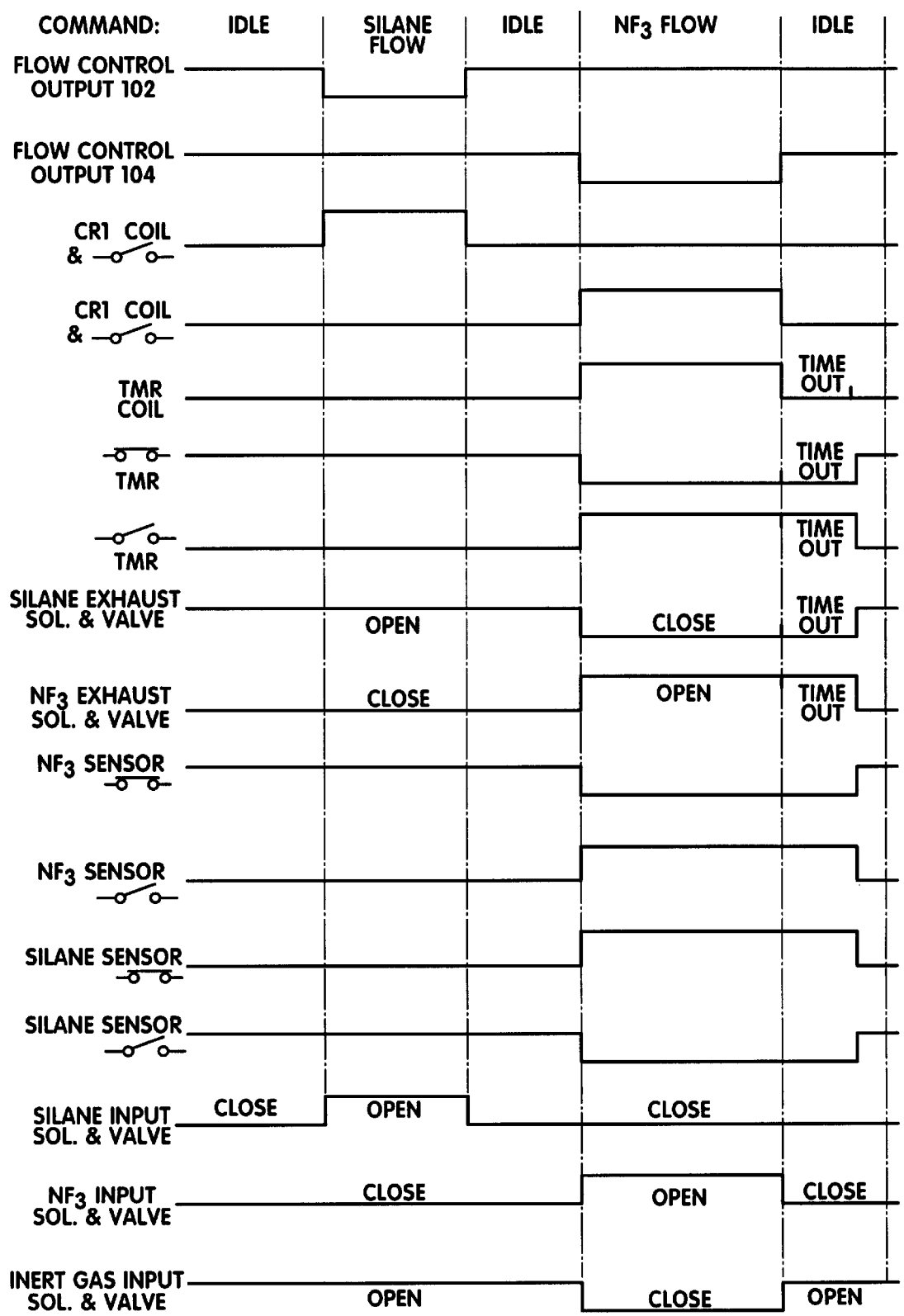
FIG. 3 is a timing chart illustrating the operation of the exhaust gas flow control system.

The electrical schematic diagram of FIG. 2 illustrates a circuit for interlocking the operation of the silane and nitrogen trifluoride input valves 47, 49 and coordinating their operation with the respective silane and nitrogen trifluoride exhaust valves 72, 82 such that the silane and nitrogen trifluoride gases are never mixed. FIG. 3 is a timing chart illustrating the states of the devices in FIG. 2 during different operating cycles. Gas flow control 100 is a combination of known control apparatus and devices which are used to control the operation of the gas flow control system of FIG. 1. More particularly, the gas flow control 100 provides the appropriate signals to the solenoids 38–40, 50–52 and mass flow controllers 44–46, as well as other solenoids and controllers to control the flows of the silane, nitrogen trifluoride, and inert gases according to the desired mode of operation. The other components in the circuit of FIG. 2 are utilized with the known gas flow control 100 to further isolate the flow of the silane and nitrogen trifluoride gases. Pursuant to its normal operation prior to the invention, the gas flow control 100 provided output signals on line 102 and 104 that were the only signals used to operate the silane and nitrogen trifluoride input solenoids 50 and 52, respectively. The present invention as illustrated in FIG. 2 modifies how the silane and nitrogen trifluoride input solenoids 50, 52 are energized and further provides a circuit that interlocks the operation of the input solenoids 50, 52 with the states of the exhaust valves 72, 82.

The operation of the circuit of FIG. 2 will be described with respect to three operating modes and in conjunction with the timing chart of FIG. 3. The first mode is an idle mode, which is a default condition of the circuit and represents a condition in which the reactor 20 is not implementing an CVD process. In the idle mode, the outputs 102, 104 from the gas flow control 100 are in a state that causes the silane solenoids 38, 50 to maintain the silane input valves 34, 47 closed. Preferably, the state of the signals on outputs 102, 104 that state is +24 volts DC ("VDC"). With the outputs 102, 104 at 24 volts VDC and 24 volts VDC being applied to line 106, there is no voltage drop nor current flow between the outputs 102 and 104 and the line 106; and therefore, the silane input solenoid 50 and nitrogen trifluoride input solenoid 52 remain de-energized, that is, in a state holding their respective valves 47, 49 closed. Simultaneously, the normally-closed timer contacts 108 provide a current path for the silane exhaust solenoid 74, thereby energizing the solenoid 74, which, in turn, provides pneumatic pressures on its output 75 to open the silane exhaust valve 72.

The current path through contacts 108 also energizes control relay coil 109 which closes its normally-open contacts 111, thereby illuminating a silane OPEN light 113 indicating that the silane exhaust valve is open. The control relay 109 also opens its normally-closed contacts 115, thereby disconnecting power from and extinguishing the silane CLOSED light 117. The lights 113 and 117 are normally located on an operator control panel with other lights and signals indicating the operating states of components associated with the CVD reactor 20.

The action of opening the exhaust valve 72 is effective to close normally-open silane exhaust sensor contacts 110 and open the normally-closed silane exhaust sensor contacts 112. The contacts 110,112 are preferably a part of the exhaust valve and are operated by the physical motion of the exhaust valve 72 as it moves between its open and closed positions. As a further condition of the idle mode, the normally-open timer contacts 114 remain open, and hence, the nitrogen trifluoride exhaust solenoid 80 is de-energized, which, in turn, provides pneumatic pressures on its output 81 (FIG. 1) to close the nitrogen trifluoride exhaust valve 82. The nitrogen trifluoride exhaust valve 82 also has sensor contacts which are responsive to its physical state. With the exhaust valve 82 closed, the normally-closed nitrogen trifluoride exhaust sensor contacts 116 are closed, and the normally-opened nitrogen trifluoride exhaust sensor contacts 118 are open. With the contacts 114 open, the control relay coil 119 is de-energized which maintains its normally-open contacts 121 open and its normally-closed contacts 123 closed. The normally-closed contacts 121 supply power to illuminate a nitrogen trifluoride CLOSED light 125 indicating to an operator that the nitrogen trifluoride exhaust valve is closed. The open contacts 121 keep the nitrogen trifluoride OFF light 127 extinguished.

In summary, referring to FIG. 3, during the idle mode, the silane and nitrogen trifluoride input solenoids 50, 52 are de-energized, thereby maintaining their respective valves closed; however, the inert input solenoid is open to provide a flow of inert gas through the reactor 20. Further, the silane exhaust solenoid 74 is energized to open the silane exhaust valve 72, and the nitrogen trifluoride exhaust solenoid 80 is de-energized, thereby closing the nitrogen trifluoride exhaust valve 82. Hence, the inert gas flows through the reactor 20 and is exhausted by the pumps 53 through the silane exhaust valve 72.

During a CVD process, a recipe may call for the flow of silane and tungsten hexafluoride gases. In that situation, the gas flow control 100 provides signals to the silane input solenoid 38 and mass flow controller 44 to initiate the flow of silane gas from the silane gas source 30. In addition, the control 100 switches the state of the output of 102, for example, to a ground potential, thereby creating a voltage drop of 24 volts between the output 102 and the line 106. That voltage drop is effective to energize the silane control relay coil 120 which causes the normally-open contacts 122 of relay 120 to close. Closing contacts 122 creates a current path through contacts 122, the closed contacts 110, contacts 116, silane input solenoid 50 to output line 102, thereby energizing the input solenoid 50. Silane input solenoid 50 then produces pneumatic pressures on its output to change the state, that is, open the silane output valve 47, thereby permitting silane gas to flow through the valve 47 and mix with the inert gas flowing through the manifold 26. The mixture of the silane, tungsten hexafluoride and inert gases flows through the reactor 20, through the pumps 53, and out the silane exhaust valve 72. Therefore, referring to FIG. 3, during the flow of silane gas, the only change from the idle mode is that the silane input valve 47 is open.

The gas flow control 100 maintains the silane input solenoid 50 energized for a period of time determined by the recipe for the particular chemical vapor deposition process being implemented. After that period of time, the gas flow control 100 toggles with the state of its output 102, that is, switches it back to 24 VDC, thereby terminating the voltage drop and current flow between output 102 and line 106 and de-energizing control relay 120. When control relay 120 is de-energized, its normally-open contacts 122 open, thereby de-energizing the silane input solenoid 50, causing its pneumatic output to return to its original state. That action causes silane input valve 47 to close, thereby terminating the flow of silane gas through the manifold 26 and the reactor 20; and hence, as can be seen from FIG. 3, only the inert gas continues to flow.

Reviewing the above operation with respect to FIGS. 2 and 3, It should be noted that before the silane input solenoid 50 can be energized, it is required that the silane exhaust valve be open, thereby closing the normally-open contacts 110. If the silane exhaust valve is not open, the silane exhaust sensor contacts 110 will be open, and the silane input solenoid 50 cannot be energized. Similarly, it is also required that the nitrogen trifluoride exhaust valve 82 be closed, which closes the normally-closed contacts 116 of the nitrogen trifluoride exhaust valve sensor. If for any reason, the nitrogen trifluoride exhaust valve 82 is open or in a partially open position, the normally-closed contacts 116 will be open, thereby prohibiting the energization of the silane input solenoid 50.

Referring to FIG. 1, when the gas flow control 100 is commanded to activate the chemical cleaning mode, it energizes the solenoid 40 and mass flow controller 46, thereby initiating a flow of nitrogen trifluoride from the nitrogen trifluoride source 32. Simultaneously, the gas flow control 100 de-energizes the inert solenoids 39, 51 and inert mass flow controller 45, thereby closing the inert valves 35, 48 and terminating the flow of inert gas through the manifold 26 and reactor 20. Further, if required, the gas flow control will terminate the flow the tungsten and inert gas mixture to manifold 28. In addition, referring to FIG. 2, the gas flow control 100 switches the state of the output signal on line 104, for example, to ground, thereby providing a voltage drop and current path between outputs 104 and 106. That condition is effective to energize the nitrogen trifluoride control relay coil 130 and timer coil 134. Energization of the timer coil 134 immediately opens the normally-closed timer contacts 108 and closes the normally-open timer contacts 114. Opening contacts 108 de-energizes the silane exhaust solenoid 74, thereby causing the silane exhaust valve to close; and closing contacts 114 energizes the nitrogen trifluoride exhaust solenoid 80, thereby causing the nitrogen trifluoride exhaust valve 82 to open. Opening the normally-closed contacts 108 also de-energizes the control relay coil 109 which opens the contacts 111, thereby extinguishing the silane OPEN light 113 and closes the contacts 115 to illuminate the silane CLOSED light 117. In addition, closing the normally-open contacts 114 energizes control relay coil 119 which opens the contacts 123, thereby extinguishing the nitrogen trifluoride light CLOSED light 125 and closes contacts 121 to illuminate the nitrogen trifluoride OPEN light 127. When the silane exhaust valve closes, it causes the normally-open silane exhaust sensor contacts 110 to open and the normally-closed silane exhaust sensor contacts 112 to close. Further, closing the nitrogen trifluoride exhaust valve 82 opens its normally-closed exhaust sensor contacts 116 and closes its normally-open sensor contacts 118.

Energizing the nitrogen trifluoride control relay coil 130 causes its normally-open contacts 132 to close, thereby creating a current path through the closed nitrogen trifluoride sensor contacts 118, the closed silane sensor contacts 112, and the nitrogen trifluoride input solenoid 52. Energizing the nitrogen trifluoride input solenoid 52 causes a change of pneumatic pressures on its output to open the nitrogen trifluoride output valve 49, thereby permitting nitrogen trifluoride gas to flow through the input valve 49, manifold 28, the reactor 20, the pumps 53, and the nitrogen trifluoride exhaust valve 82. Referring to FIGS. 2 and 3, it should be noted that in order to initiate the flow of nitrogen trifluoride, the nitrogen trifluoride input solenoid 52 cannot be energized unless the silane exhaust valve 72 is closed, as detected by the closing of the normally-closed silane sensor contacts 112. Further, the nitrogen trifluoride exhaust valve 82 must be open as detected by the closing of the normally-open nitrogen trifluoride sensor contacts 118. Therefore, if the exhaust valves 72, 82 are not in their desired positions, the nitrogen trifluoride input solenoid 52 cannot be energized.

At the end of the cleaning cycle, the gas flow control 100 de-energizes the solenoid 40 and mass flow controller 46 to terminate the flow of nitrogen trifluoride from the nitrogen trifluoride source 32. At the same time, the gas flow control 100 switches its output 104 to its original state, that is, 24 VDC, thereby eliminating the voltage drop between output 104 and line 106. That de-energizes the control relay coil 130, thereby opening the normally-open control relay contacts 132 and terminating the flow of current through the nitrogen trifluoride input solenoid 52. De-energizing the solenoid 52 causes the nitrogen trifluoride input valve 49 to close, thereby terminating the flow of nitrogen trifluoride through the manifold 28 and reactor 20. In addition, the gas flow control simultaneously operates the inert gas solenoids 39, 51 and the inert gas mass flow controller 45 to again initiate the flow of inert gas through the manifold 26 and the reactor 20.

Referring to FIG. 3, it should be noted that the nitrogen trifluoride exhaust valve 82 is still open. Upon the timer coil 134 being de-energized, the timer enters a time delay mode which maintains the normally-closed open contacts 108 open and the normally-open contacts 114 closed for a predetermined period of time. During that time-out period, the nitrogen trifluoride exhaust valve 82 is maintained open, and the silane exhaust valve 72 is maintained closed. Therefore, the inert gas flowing through the manifold 28 and the reactor 20 is effective to purge any of the nitrogen trifluoride from the reactor 20 and pumps 53. Thus, the time-out period provides an automatic buffer period of inert gas flow after terminating the flow of the nitrogen trifluoride. At the end of the time delay, the normally-closed timer contacts 108 close and energize the silane exhaust solenoid 74, thereby opening the silane exhaust valve 72. In addition, the control relay 109 is energized, thereby extinguishing the silane CLOSED light 117 and illuminating the silane OPEN light 113. In addition, at the same time, the normally-open timer contacts 114 open and de-energize the nitrogen trifluoride exhaust solenoid 80 which, in turn, closes the nitrogen trifluoride exhaust valve 82. Opening the normally-open contacts 114 also de-energizes the control relay 119 which is effective to extinguish the nitrogen trifluoride OPEN light 127 and illuminate the nitrogen trifluoride CLOSE light 125. At this point, the system has returned to its default or idle mode.

While the invention has been illustrated by the description of one embodiment, and while that embodiment has been described in considerable detail, there is no intention to restrict or in any way limit the scope of the appended claims to such detail. Additional advantages and modifications will readily appear to those who are skilled in the art. For example, in the above description, the exhaust gas valve controls were applied to silane and nitrogen trifluoride gases; however, as will be appreciated, the same interlock between input gas solenoids and exhaust gas valves can be applied to other gases within the CVD system as well as other gas processing systems. As will be appreciated, while the described embodiment interlocks the input and exhaust valves for two different gases, the interlock scheme as described herein may be applied to systems having more than two gas exhaust paths and corresponding valves. In addition, while the example herein interlocks gas input valves to gas exhaust valves, the same interlock technique may be applied to distribution valves in a gas distribution system. Further, while the circuits of FIG. 2 are illustrated as operating with 24 volts AC and 24 volts DC, any control signal voltages may be used.

The invention, in its broadest aspects, is, therefore, not limited to the specific details shown and described. Consequently, departures may be made from the details described herein without departing from the spirit and scope of the claims which follow.

What is claimed is:

1. An apparatus for controlling the flow of exhaust gases from a chamber comprising:

a plurality of sources of gases;

a plurality of gas input valves, each of the plurality of gas input valves being connected between one of the plurality of sources of gases and the chamber, and each gas input valve being selectively moved to open and closed positions to initiate and terminate, respectively, a flow of its respective gas to the chamber;

at least one pump having an inlet fluidly connected to the chamber for exhausting the gases from the chamber;

a plurality of gas exhaust valves connected to an outlet of the pump, each gas exhaust valve being selectively moved to open and close positions to initiate and terminate, respectively, a flow of gas from the chamber; and a controller providing
a first gas supply signal commanding open and close positions of a first gas input valve,
other gas supply signals commanding open and close positions of other gas input valves,
the controller having
a first circuit for opening a first gas exhaust valve and closing other gas exhaust valves in response to the other gas supply signals commanding the other gas input valves to close, and a second circuit causing the first gas input valve to open in response to the simultaneous occurrences of the first gas supply signal commanding the first gas input valve to open, and the open position of the first gas exhaust valve, and the closed position of the other gas exhaust valves.

2. An apparatus for controlling the flow of exhaust gases from a chamber comprising:

first and second sources of gases;

first and second gas input valves, each of the first and second gas input valves being connected between one of the sources of gases and the chamber, and each gas input valve being selectively moved to open and closed positions to initiate and terminate, respectively, a flow of its respective gas to the chamber;

at least one pump having an inlet fluidly connected to the chamber for exhausting the gases from the chamber;

first and second gas exhaust valves connected to an outlet of the pump, each gas exhaust valve being selectively moved to open and close positions to initiate and terminate, respectively, a flow of gas from the chamber; and a controller providing a first gas supply signal commanding open and close positions of the first gas input valve, a second gas supply signal commanding open and close positions of the second gas input valve, the controller having a first circuit for opening the first gas exhaust valve and closing the second gas exhaust valves in response to the second gas supply signal commanding the second gas input valve to close, and a second circuit causing the first gas input valve to open in response to the simultaneous occurrences of the first gas supply signal commanding the first gas input valve to open, and the open position of the first gas exhaust valve, and the closed position of the second gas exhaust valve.

3. An apparatus for controlling the flow of exhaust gases from a chamber comprising:

first and second sources of gases;

first and second gas input valves connected between the respective first and second sources and the chamber, each gas input valve being selectively moved to open and closed positions to initiate and terminate, respectively, a flow of its respective gas to the chamber;

at least one pump having an inlet fluidly connected to the chamber for exhausting the gases from the chamber;

first and second gas exhaust valves connected to an outlet of the pump, each gas exhaust valve being selectively moved to open and close positions to initiate and terminate, respectively, a flow of its respective gas to the chamber; and a controller providing a first gas supply signal having ON and OFF states commanding open and close positions, respectively, of the first gas input valve, a second gas supply signal having ON and OFF states commanding open and close positions of the second gas input valve, the controller having a first circuit for opening the first gas exhaust valve and closing the second exhaust valve in response to detecting the OFF state of the second gas supply signal, and a second circuit causing the first gas input valve to open in response to the simultaneous occurrences of the ON state of the first gas supply signal, and the open position of the first gas exhaust valve, and the closed position of the second gas exhaust valve.

4. The apparatus of claim 3 wherein the second circuit causes the first gas input valve to close in response to the first circuit detecting at least one of the OFF state of the first gas supply signal, the closed position of the first gas exhaust valve, and the open position of the second gas exhaust valve.

5. The apparatus of claim 4 wherein the first circuit is responsive to detecting the ON state of the second gas supply signal for closing the first gas exhaust valve and opening the second gas exhaust valve.

6. The apparatus of claim 5 wherein the first circuit causes the second gas input valve to open in response to the simultaneous occurrence of the ON state of the second gas supply signal, and the close position of the first gas exhaust valve, and the open position of the second gas exhaust valve.

7. The apparatus of claim 6 wherein the first circuit causes the second gas input valve to close in response to the second circuit detecting at least one of the OFF state of the second gas supply signal, the open position of the first gas exhaust valve, and the close position of the second gas exhaust valve.

8. The apparatus of claim 7 wherein the first circuit closes the second gas exhaust valve and opens the first gas exhaust valve a predetermined period of time after an occurrence of the OFF state of the second gas supply signal.

9. A method of controlling the flow of a plurality of gases from a chamber, through a pump and through a plurality of exhaust valves, the chamber having gas inlets connected to a plurality of input valves being connected in turn to respective sources of the plurality of gases, respectively, a first input valve being commanded to open in response to a first gas supply signal, and other input valves being commanded to close in response to other gas supply signals, the method comprising:

opening a first exhaust valve and closing other exhaust valves in response to the other gas supply signals commanding the other input valves to close, opening a first input valve in response to the simultaneous occurrences of the first gas supply signal commanding the first input valve to open, the first exhaust valve being open and other exhaust valves being closed; and closing the first input valve in response to an occurrence of at least one of the first gas supply signal commanding the first input valve to close, the first exhaust valve closing and the second exhaust valve opening.

10. The method of claim 9 further comprising the steps of:

closing the first exhaust valve and opening another exhaust valve in response to a second gas supply signal commanding a second input valve to open;

opening the second input valve in response to the simultaneous occurrences of the second gas supply signal commanding the second input valve to open, and the second exhaust valve being open and other exhaust valves being closed; and closing the second input valve in response to an occurrence of at least one of, the second gas supply signal commanding the second input valve to close, the second exhaust valve closing or the other exhaust valves opening.

* * * * *